United States Patent
Arakawa

(10) Patent No.: US 9,111,630 B2
(45) Date of Patent: Aug. 18, 2015

(54) ELECTRONIC DEVICE WITH A REGISTER FOR CONTROLLING THE OPERATIONS OF A NON-VOLATILE MEMORY AND A VOLATILE MEMORY THEREIN

(71) Applicant: PANASONIC CORPORATION, Osaka (JP)

(72) Inventor: Kenji Arakawa, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/226,444

(22) Filed: Mar. 26, 2014

(65) Prior Publication Data

US 2014/0293690 A1 Oct. 2, 2014

(30) Foreign Application Priority Data

Mar. 28, 2013 (JP) .................................. 2013-068125
Mar. 7, 2014 (JP) .................................. 2014-044583

(51) Int. Cl.
*G11C 5/14* (2006.01)
*G11C 16/30* (2006.01)
*G11C 16/32* (2006.01)
*G11C 11/4074* (2006.01)

(52) U.S. Cl.
CPC ............ *G11C 16/30* (2013.01); *G11C 11/4074* (2013.01); *G11C 16/32* (2013.01)

(58) Field of Classification Search
CPC ........ G11C 5/144; G11C 5/148; G11C 16/30; G11C 14/0018
USPC .................... 365/229, 228, 227, 226, 189.05, 365/189.09, 189.12, 185.08, 185.18
See application file for complete search history.

(56) References Cited

U.S. PATENT DOCUMENTS

| | | | |
|---|---|---|---|
| 6,687,164 B2 * | 2/2004 | Matsuda et al. | 365/185.29 |
| 7,317,632 B2 * | 1/2008 | Chen et al. | 365/185.08 |
| 7,934,106 B2 * | 4/2011 | Ninomiya et al. | 713/300 |

FOREIGN PATENT DOCUMENTS

JP 2010-026674 A 2/2010

* cited by examiner

*Primary Examiner* — Andrew Q Tran
(74) *Attorney, Agent, or Firm* — McDermott Will & Emery LLP

(57) ABSTRACT

An electronic device of the present technique includes a controller part for controlling operations of a non-volatile memory and a volatile memory, a power supply controller for controlling power to the controller part and the volatile memory, and a register for retaining running information about a program read from the non-volatile memory. When power is supplied to the controller part from the power supply controller and the running information about the program is not retained in the register, the controller part reads the program from the non-volatile memory and stores it in the volatile memory so as to execute the program, and retains the running information about the program in the register. When the running information about the program is retained in the register, the program is read from the volatile memory so as to be executed.

5 Claims, 4 Drawing Sheets

ELECTRONIC DEVICE WITH A REGISTER FOR CONTROLLING THE OPERATIONS OF A NON-VOLATILE MEMORY AND A VOLATILE MEMORY THEREIN

RELATED APPLICATIONS

This application claim the benefit of Japanese Application No. 2013-068125, filed on Mar. 28, 2013 and Japanese Application No. 2014-044583, filed Mar. 7, 2014, the disclosures of which Applications are incorporated by reference herein.

BACKGROUND OF THE INVENTION

1. Field of the Invention

The present technique relates to an electronic device in which a program is read from a non-volatile memory so as to be stored in a volatile memory, and the program is acquired from the volatile memory so as to be executed.

2. Description of the Related Art

Unexamined Japanese Patent Publication No. 2010-26674 discloses an electronic device in which a RAM (Random Access Memory) and a ROM (Read Only Memory) are connected to a CPU (Central Processing Unit). Unexamined Japanese Patent Publication No. 2010-26674 discloses that when power is turned off, the CPU transfers a value of a stack pointer from the RAM to the ROM.

SUMMARY OF THE INVENTION

An electronic device according to the present technique includes a non-volatile memory in which a program is stored, a volatile memory in which the program read from the non-volatile memory is stored, a controller part for controlling operations of the non-volatile memory and the volatile memory, a power supply controller for controlling power to the controller part and the volatile memory, and a register for retaining running information about the program read from the non-volatile memory. When power is supplied from the power supply controller and the running information about the program is not retained in the register, the controller part reads the program from the non-volatile memory and stores the program in the volatile memory so as to run the program, and retains the running information about the program in the register. When the running information about the program is retained in the register, the controller part reads the program from the volatile memory so as to run the program.

DETAILED DESCRIPTION OF THE PREFERRED EMBODIMENT

Hereinafter, with reference to the drawings, an embodiment is described in detail by exemplifying an imaging apparatus as an electronic device according to one embodiment of the present technique. However, unnecessarily detailed description may occasionally be omitted. For example, detailed description of well-known matters and redundant description of substantially the same configurations may occasionally be omitted. This is to avoid the following description from becoming unnecessarily redundant, and to ease understanding of those skilled in the art.

Incidentally, the inventor intends to provide the following description and the accompanying drawings to allow any person skilled in the art to fully understand the present technique, and does not intend to limit the subject matter defined in the claims by the following description.

1. Configuration of Imaging Apparatus

Figure 1:
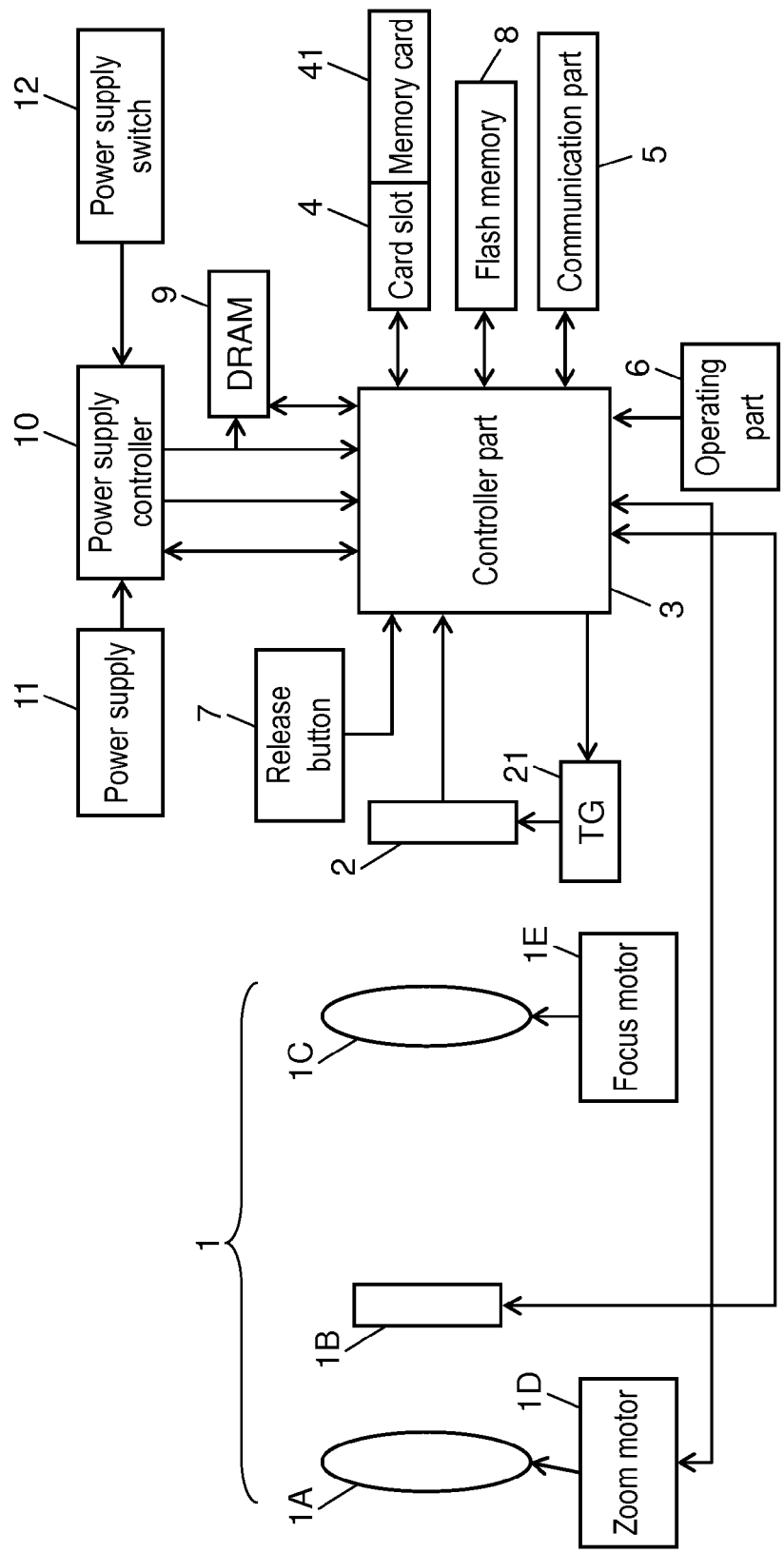
FIG. 1 is a block diagram illustrating a configuration of an imaging apparatus according to one embodiment of the present technique.

FIG. 1 is a block diagram illustrating a configuration of an imaging apparatus according to one embodiment of the present technique.

As shown in FIG. 1, the imaging apparatus is configured such that a subject image formed by optical system 1 is imaged by image sensor 2 and an image signal is generated.

Optical system 1 has zoom lens 1A, mechanical shutter 1B, and focus lens 1C. Further, optical system 1 further has another optical part such as a correcting lens, not shown. Zoom lens 1A can be moved along an optical axis of optical system 1, and a focal distance can be changed according to this movement. Zoom motor 1D drives zoom lens 1A along the optical axis.

Mechanical shutter 1B transmits or blocks light incident on image sensor 2 at a photographing time through control of controller part 3. Mechanical shutter 1B is a shutter having a front curtain and a rear curtain. Mechanical shutter 1B is controlled according to a shutter speed set by controller part 3. Mechanical shutter 1B is operated at timing in which a shutter switch is fully pressed.

Focus lens 1C can move along the optical axis, and can change a focus state of a subject image according to the movement. Focus motor 1E drives focus lens 1C along the optical axis.

Image sensor 2 images a subject image formed by optical system 1 so as to generate an image signal of a digital signal. Timing generator (TG) 21 transmits a synchronous signal to image sensor 2 according to an instruction from controller part 3. The operation of image sensor 2 is controlled by variously changing the synchronous signal.

Controller part 3 controls the imaging apparatus entirely. Controller part 3 can be realized by, for example, a microcomputer. Further, controller part 3 may be configured of one semiconductor chip, or separately configured of a semiconductor chip realizing an image processor and a semiconductor chip realizing an operation controller. Further, controller part 3 may be configured of a control board mounted with a semiconductor chip and a peripheral circuit.

Memory card 41 can be attached to card slot 4, and card slot 4 transmits/receives data to/from memory card 41. Communication part 5 transmits/receives data to/from controller part 3. Operating part 6 is configured of cross keys, pressing buttons and a touch panel, and is a member for various setting in the imaging apparatus. Release button 7 is an operating member for giving a photographing release instruction to controller part 3 through a user's pressing operation.

A program to be used in controller part 3, and data generated by the imaging apparatus are stored in NAND type flash memory 8 as a non-volatile memory. Flash memory 8 is electrically connected to controller part 3.

DRAM (Dynamic Random Access Memory) 9 as a volatile memory is configured of LPDDR (Low Power Double Data Rate), and a program read from flash memory 8 by controller part 3 can be stored therein. DRAM 9 is electrically connected to controller part 3 and power supply controller 10.

Power supply controller 10 supplies power from power supply 11 to controller part 3 and DRAM 9. As power supply 11, a lithium ion battery or a nickel-hydrogen battery, or a power supply for household use via an AC adapter is considered.

Power switch 12 transmits, to power supply controller 10, a signal representing ON/OFF state of the power supply in order to operate the ON/OFF state of controller part 3 based on a user's operation. When receiving the signal representing the ON/OFF state of the power supply from power switch 12, power supply controller 10 controls supply of power to controller part 3 and DRAM 9 according to this signal.

2. Configurations Relating to Power Control of Controller Part and DRAM

Figure 2:
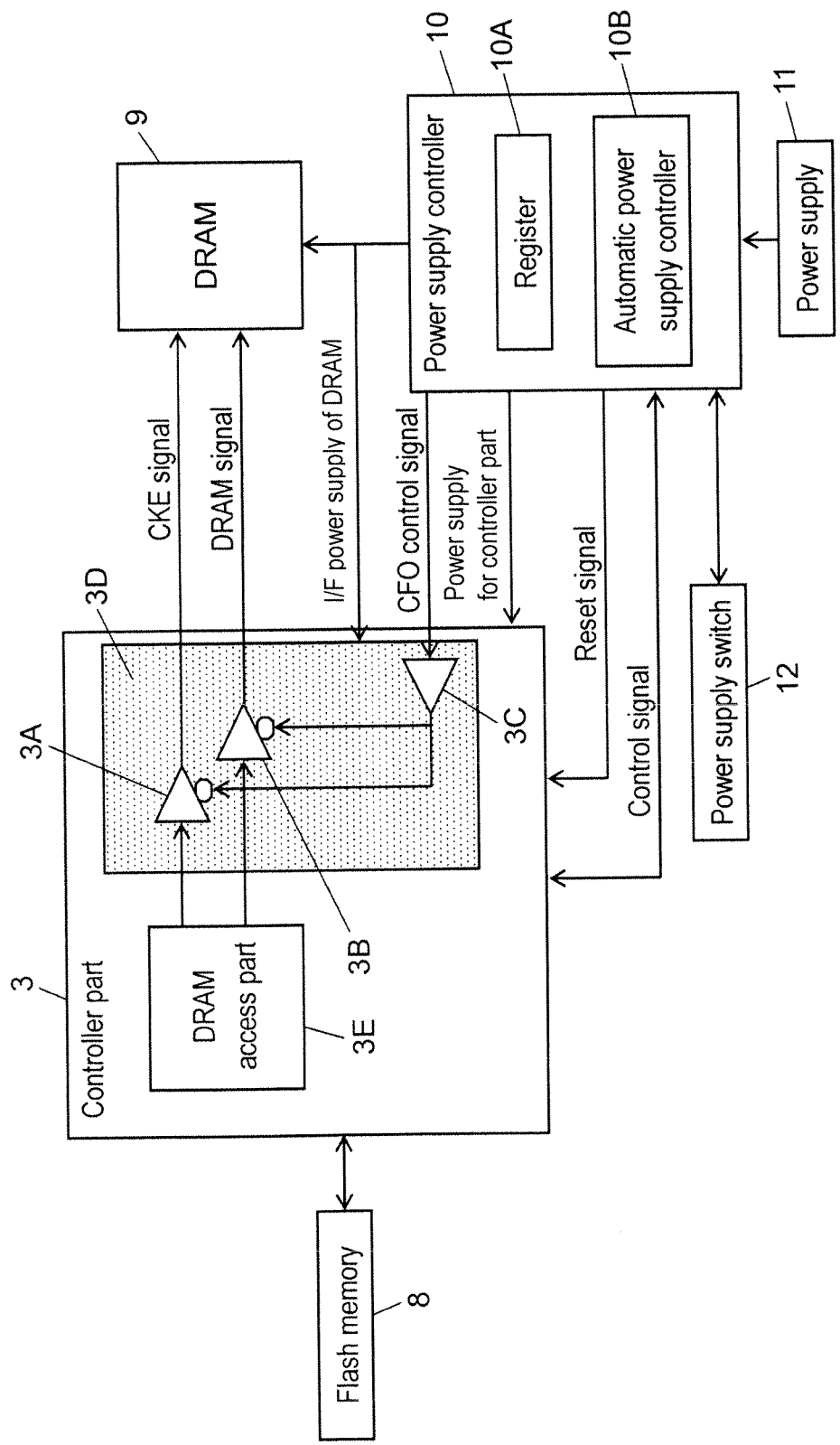
FIG. 2 is a block diagram illustrating exchange of signals with a configuration of a main part in FIG. 1.

FIG. 2 is a block diagram illustrating exchange of signals with the configuration of the main part in FIG. 1.

As shown in FIG. 2, controller part 3 is driven by a power supply for the controller part from power supply controller 10. Controller part 3 receives a reset signal from power supply controller 10, and can make a transition between a reset state and a reset releasing state according to the received reset signal. When making the transition from the reset state to the reset releasing state, controller part 3 reads a program from NAND type flash memory 8 as a non-volatile memory.

Further, controller part 3 can make power supply controller 10 read or write the state of controller part 3 by means of a control signal. Concretely, controller part 3 retains running information about the program such as the number of running times of the program read from NAND type flash memory 8 in register 10A provided to power supply controller 10.

Controller part 3 can change a power supply voltage of controller part 3 supplied from power supply controller 10 using a control signal according to the operating state of controller part 3.

Further, controller part 3 has a signal fixing part configured of CKE (Clock Enable) signal fixing logic gate 3A, DRAM signal fixing logic gate 3B and logic gate 3C. CKE signal fixing logic gate 3A fixes an output logic of a CKE signal serving as a clock enable signal supplied to DRAM 9. DRAM signal fixing logic gate 3B fixes an output logic of a DRAM signal supplied to DRAM 9, such as an address signal or a data signal. Logic gate 3C performs an input tolerant function according to a CFO control signal as a control signal transmitted from power supply controller 10. Further, controller part 3 has island-shaped power supply part 3D separated from another power supply line. Power for an interface (I/F) signal of DRAM 9 is supplied to power supply part 3D from power supply controller 10, so that a voltage is supplied to logic gates 3A, 3B and 3C configuring the signal fixing part. When controller part 3 is configured of one semiconductor chip, island-shaped power supply part 3D may be formed as a part of a wiring part in the semiconductor chip. Further, when controller part 3 is configured of one or more semiconductor chips, island-shaped power supply part 3D may be formed as a part of the wiring part on a wiring substrate mounted with the semiconductor chip.

Controller part 3 performs a retention function for fixing the output logic on CKE signal fixing logic gate 3A and DRAM signal fixing logic gate 3B. CKE signal fixing logic gate 3A fixes the output logic of the CKE signal to be output to DRAM 9 through a CFO control signal transmitted from power supply controller 10. DRAM signal fixing logic gate 3B fixes the output logic of an input signal to DRAM 9, such as an address signal or a data signal. Logic gate 3C for an input tolerant function of a CFO control signal performs the input tolerant function. When a voltage range of the CFO control signal transmitted from power supply controller 10 exceeds a range of a power supply voltage of the I/F signal of DRAM 9, logic gate 3C performs a tolerant function for properly capturing a logic. As a result, while controller part 3 is being controlled by the CFO control signal, controller part 3 is controlled by logical information fixed by logic gates 3A and 3B of the signal fixing part, but is not controlled by logical information about a CKE signal and the DRAM signal for controlling an access request to DRAM 9 that are transmitted from DRAM access part 3E provided in controller part 3.

Power supply controller 10 supplies power to DRAM 9, and supplies power for the I/F signal of DRAM 9 to power supply part 3D of controller part 3. Further, power supply controller 10 has register 10A and automatic power supply controller 10B. Register 10A retains the number of running times of the program read from NAND type flash memory 8 and a setting value for controlling the CFO control signal. Automatic power supply controller 10B activates or stops controller part 3 at every predetermined time.

In the configuration shown in FIG. 2, the power from power supply controller 10 is supplied to DRAM 9 and to power supply part 3D for the I/F signal of DRAM 9. One power circuit is shared as a power circuit of DRAM 9 and a power circuit for the I/F signal of DRAM 9. As a result, when an operating frequency of DRAM 9 is higher, an impedance of the DRAM signal is reduced, so that a waveform of the DRAM signal can be improved. Further, controller part 3 controls the signal fixing part configured of logic gates 3A, 3B and 3C using the CFO control signal, and controls to fix the output logic of the DRAM signal. As a result, unnecessary leak current generated between DRAM 9 and controller part 3 can be reduced.

3. Operations of Controller Part and DRAM

Figure 3:
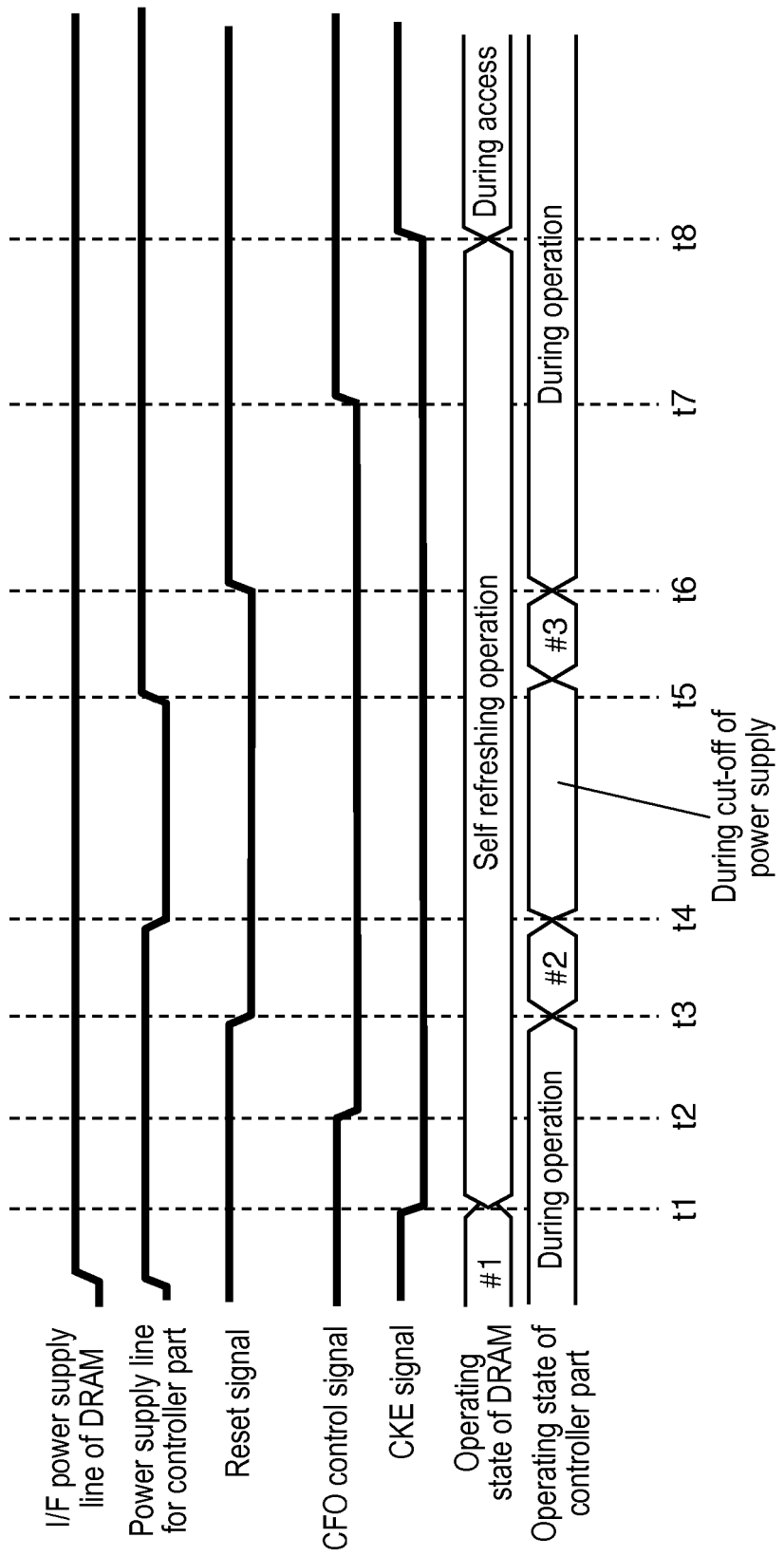
FIG. 3 is a timing chart illustrating examples of various power supply voltages supplied from a power supply controller, a reset signal, a control signal for a retention function (hereinafter referred to as "a CFO control signal"), a CKE signal, a DRAM operating state, and an operating state of a controller part.

FIG. 3 is a timing chart illustrating examples of various power supply voltages supplied from the power supply controller, a reset signal, a CFO control signal, a CKE signal, the DRAM operating state, and the operating state of the controller part.

In FIG. 3, timing t1 indicates a timing of a normal operating state of the imaging apparatus. At this timing, controller part 3 is in the operating state, and in this state, DRAM access part 3E of controller part 3 accesses to DRAM 9. At this time, power is supplied via an I/F power supply line of DRAM 9 and a power supply line for a controller part to controller part 3 and power supply part 3D, and the reset signal is in a release state. Further, the control through a CFO control signal is released, and a signal output from DRAM access part 3E is validated.

Further, a CKE signal is suitably controlled into a low (L)/high (H) state according to a state of DRAM access part 3E. While an access from DRAM access part 3E is validate, the CKE signal is H. When the access to DRAM 9 is not necessary, a self refresh command is issued from DRAM access part 3E to DRAM 9, and the CKE signal is set to L. As a result, DRAM 9 can retain data in DRAM 9 through a minimum current.

Symbol t2 represents timing in a case of a condition that power of controller part 3 is cut off in a state that DRAM 9 is in the self refresh operating state. At this timing, a control signal is transmitted from controller part 3 to power supply controller 10, and control is made by the CFO control signal, so that the CFO control signal from power supply controller 10 is set to L. As a result, the CKE signal output from DRAM access part 3E and an access signal to DRAM is invalidated, and DRAM 9 is fixed into a specific logic, and the self refresh operating state of DRAM 9 is maintained regardless of the state of the DRAM access part 3E.

Symbol t3 represents timing at which after controller part 3 transfers to control through the CFO control signal, controller part 3 is in the reset state. At this timing, a control signal is transmitted from controller part 3 to power supply controller 10, and a reset signal from power supply controller 10 is set to L in order that controller part 3 is brought into the reset state. As a result, controller part 3 is in the reset state.

Symbol t4 represents timing at which power supply controller 10 transmits the reset signal to controller part 3, and after the reset state, power supply via the power supply line for controller part is stopped. At this timing, although the power supply via the power supply line for controller part to controller part 3 is stopped, power is continuously supplied to CKE signal fixing logic gate 3A, DRAM signal fixing logic gate 3B, logic gate 3C for performing the input tolerant function of the CFO control signal, and power supply part 3D (to which the I/F power supply line of DRAM 9 is connected), in controller part 3.

Symbol t5 represents timing in a case where when a user turns ON power switch 12, or turns ON the power supply for controller part after predetermined time passes in power supply controller 10. At this timing, even when the power supply for controller part is turned ON, the reset signal is at L, and in the reset state. For this reason, controller part 3 is in the reset state. Also at this time, the self refresh operating state continues in DRAM 9.

Symbol t6 represents timing in a case where after predetermined time passes in power supply controller 10, the reset signal of controller part 3 is set into H. At this time, when the reset signal is brought into H and the reset state of controller part 3 is released, controller part 3 goes to the activating operation and reads a program from flash memory 8 so as to perform the reading operation.

Symbol t7 represents timing at which after predetermined time passes in controller part 3, a control signal is transmitted to power supply controller 10, and control through the CFO control signal is released. At this timing, the CFO control signal is brought into H. As a result, the CKE signal and a DRAM access signal output from DRAM access part 3E are validated so that DRAM 9 is controlled.

Symbol t8 represents timing at which after the CFO control signal is brought into H, data is started to be read from DRAM 9. At this timing, DRAM access part 3E of controller part 3 is accessing to DRAM 9.

4. Activating Operation of Imaging Apparatus

Figure 4:
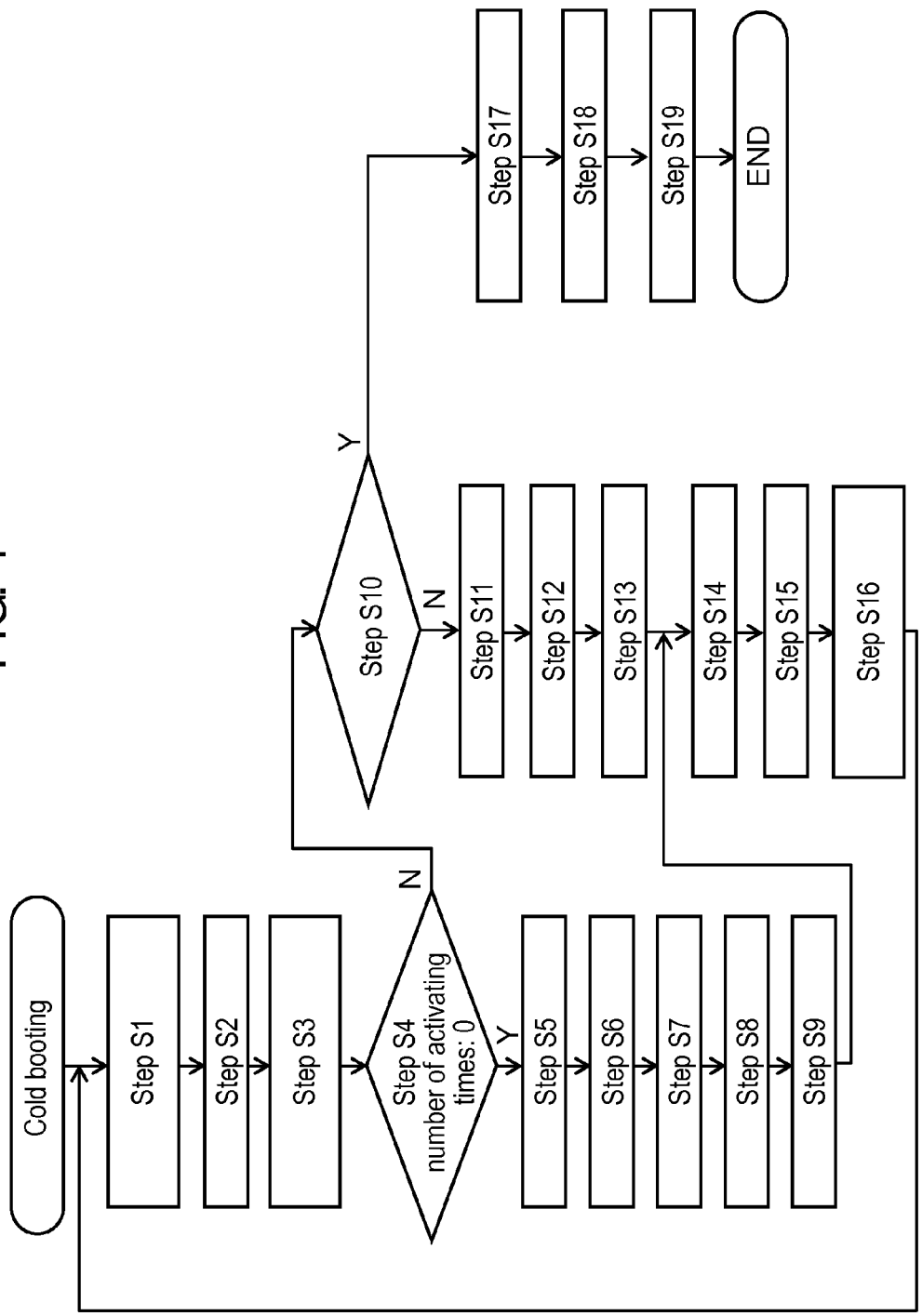
FIG. 4 is a flowchart for describing an activating operation of the imaging apparatus.

FIG. 4 is a flowchart for describing an activating operation of the imaging apparatus.

In FIG. 4, cold booting is a state that a battery is loaded or power supply controller 10 first powers on controller part 3, and controller part 3 starts the operation shown in FIG. 4.

In step S1, power supply controller 10 supplies power to controller part 3 and DRAM 9. In next step S2, controller part 3 reads a program from flash memory 8, and stores the program in DRAM 9. In next step S3, controller part 3 refers to data in register 10A of power supply controller 10, and switches a CFO control signal into H.

In next step S4, controller part 3 checks whether the number of activating time of the program recorded in register 10A as the running information is 0, and when it is 0, the sequence goes to flow "Y", and when it is not 0, the sequence goes to flow "N".

When the number of activating times of the program recorded in register 10A is 0, controller part 3 updates data about the number of activating times in register 10A of power supply controller 10 to 1 in step S5. Thereafter, in step S6, controller part 3 sets a parameter of DRAM access part 3E in controller part 3, and controller part 3 initializes DRAM 9 in step S7. Thereafter, controller part 3 adjusts delay of the I/F signal of DRAM 9 in order that DRAM access part 3E properly accesses to DRAM 9 in step S8. As a result, DRAM access part 3E can access to DRAM 9. Thereafter, controller part 3 reads a program and another data to be used in the imaging apparatus from flash memory 8 in step S9, and stores them in DRAM 9.

When the operation in step S9 is completed, controller part 3 is enabled to perform a recording operation and a reproducing operation as a camera (step S14).

After controller part 3 stores the program and the data in DRAM 9, when the operations of the imaging apparatus such as the operation of power switch 12 by the user and the reproducing operation through operating part 6 are not performed on automatic power supply controller 10B of power supply controller 10, controller part 3 is powered OFF (step S15). Further, in step S15, when the user sets a timer for powering OFF after predetermined time passes for automatic power supply controller 10B, power supply controller 10 performs the operation for powering OFF controller part 3 after predetermined time passes. With these settings, power supply controller 10 powers OFF controller part 3. At this time, the I/F power supply of DRAM 9 is kept ON.

When the operations of the imaging apparatus such as the user's operation of power switch 12 and the reproducing operation of operating part 6 are performed or power ON control of automatic power supply controller 10B of power supply controller 10 is made, power supply controller 10 powers ON controller part 3 (step S16).

Thereafter, controller part 3 executes steps S1, S2 and S3, and the data about the number of activating times recorded in register 10A is determined in step S4.

On the other hand, in step S4, controller part 3 checks whether the number of activating times of the program recorded in register 10A is 0, and when it is not 0, the sequence goes to flow "N".

When the number of activating times of the program recorded in register 10A is not 0, controller part 3 determines whether the number of activating times of the program reaches a condition that DRAM 9 is powered OFF in step S10. The condition that DRAM 9 is powered OFF in step S10 is, for example, a case where after the program is read from flash memory 8 and is stored in DRAM 9 by loading the battery and the user's operation, predetermined time passes. The determination whether the predetermined time passes can be made by detecting that automatic power supply controller 10B of power supply controller 10 activates and powers OFF controller part 3 at a predetermined number of times. Further, the condition for power-OFF is a case where a battery is used as the power supply, and includes a case where the residual capacity of the battery is less than a predetermined capacity. The determining operation in step S10 is provided because when DRAM 9 is maintained in a self-refresh state, the battery is consumed while the user does nothing. As a result, a function for powering off the entire apparatus including DRAM 9 after predetermined time passes, such a case where the user does not perform the operation, is provided, so that useless battery consumption can be prevented.

In step S10, when controller part 3 determines that the powering-OFF is not necessary, the sequence goes to flow "N", and when controller part 3 determines that the powering-OFF is necessary, the sequence goes to flow "Y". When controller part 3 determines that the powering-OFF is not necessary, in next step S11, a value of register 10A of power supply controller 10 is incremented. That is to say, the number of activating times is increased by one so that the data is updated. Thereafter, controller part 3 sets the parameter of DRAM access part 3E in step S12, and a delay of the I/F signal of DRAM 9 is adjusted in order that DRAM access part 3E properly accesses to DRAM 9 in step S13.

When step S13 is completed, controller part 3 can perform the recording operation and the reproducing operation as the imaging apparatus (step S14). In this case, the operation in step S7 and step S9 in the operating flow in steps S6 to S9 is not necessary. As a result, since the program is stored in DRAM 9, at a stage that an access to DRAM 9 is enabled, the program thereafter may be read from DRAM 9, and thus the operation for reading the program and the data from flash memory 8 and storing them in DRAM 9 does not have to be performed.

The operation flow thereafter includes steps S15 and S16.

When controller part 3 determines that the powering-OFF is necessary in step S10, the sequence goes to flow "Y", and the running information about the number of activating times recorded in register 10A of power supply controller 10 is deleted in step S17. Thereafter, after the I/F power supply of DRAM 9 is powered OFF in step S18, controller part 3 is powered OFF in step S19. As a result, the imaging apparatus is entirely powered OFF.

The electronic device according to the present technique includes a non-volatile memory in which a program is stored, a volatile memory in which the program read from the non-volatile memory is stored, a controller part for controlling operations of the non-volatile memory and the volatile memory, a power supply controller for controlling power supplies to the controller part and the non-volatile memory, and a register for retaining running information about the program read from the non-volatile memory. When power is supplied to the controller part from the power supply controller and the running information about the program is not retained in the register, the controller part reads the program from the non-volatile memory and stores it in the volatile memory so as to execute the program, and retains the running information about the program in the register. When the running information about the program is retained in the register, the program is read from the volatile memory so as to be executed.

As a result, after the program is read from the non-volatile memory and stored in the volatile memory, even if the controller part for controlling the electronic device is powered off, the program can be acquired from the volatile memory so as to be executed. As a result, the activating time of the program can be shortened.

OTHER EMBODIMENTS

The above description refers to an example of the imaging apparatus which is provided with the optical system and the image sensor separately. However, the present technique can be applied to a camera module of a smart phone or the like in which the optical system, a CMOS image sensor, and a partial image processing circuit part are integral with each other.

In the above, the embodiment has been described as an example of the technique according to the present technique. The detailed description and accompanying drawings have been provided for that purpose.

Accordingly, components shown in the accompanying drawings and described in the detailed description include not only components which are essential to solve the problems, but also components which are not essential to solve the problems, but are used for exemplifying the above-mentioned technique. Therefore, those non-essential components should not be immediately construed as essential for the reason that the non-essential components are shown in the accompanying drawings or described in the detailed description.

Also, since the above-described embodiment is to exemplify the technique according to the present disclosure, various modifications, substitutions, additions or omissions may be possible within the scope of the claims or equivalents thereof.

What is claimed is:

1. An electronic device comprising:
   a non-volatile memory in which a program is stored;
   a volatile memory in which the program read from the non-volatile memory is stored;
   a controller for controlling operations of the non-volatile memory and the volatile memory, the controller being coupled to the non-volatile memory and the volatile memory;
   a power supply controller for controlling power to the controller and the volatile memory, the power supply controller being coupled to the controller and the volatile memory; and
   a register for retaining program execution information about the program read from the non-volatile memory, the register being coupled to the power supply controller, wherein:
   when the power is supplied from the power supply controller to the controller and the program execution information about the program is not retained in the register, the controller reads the program from the non-volatile memory and stores the program in the volatile memory so as to execute the program, and
   when the program execution information about the program is retained in the register, the controller reads the program from the volatile memory without accessing the non-volatile memory so as to execute the program.

2. The electronic device according to claim 1, wherein:
   the controller determines whether or not a condition that the volatile memory is powered OFF is achieved, and
   when the controller determines that the volatile memory has to be powered OFF, the program execution information retained in the register is deleted.

3. The electronic device according to claim 2, wherein when the controller reads the program from the non-volatile memory and stores the program in the volatile memory, and then a predetermined time passes, the controller turns off power to the volatile memory.

4. The electronic device according to claim 2, wherein when a battery is used as a power supply and a residual capacity of the battery is less than a predetermined capacity, the controller turns off power to the volatile memory.

5. The electronic device according to claim 1, wherein:
   the register retains a number of times of reading the program from the non-volatile memory and then storing the program in the volatile memory, as the program execution information, and
   when the controller determines that the volatile memory does not have to be powered OFF, data about the number of times of reading in the register is updated.

* * * * *